United States Patent
Liu et al.

(10) Patent No.: US 12,200,911 B2
(45) Date of Patent: Jan. 14, 2025

(54) STRUCTURE FOR EVENLY APPLYING FORCES ON A HEAT DISSIPATION BASE PLATE

(71) Applicant: ASIA VITAL COMPONENTS (CHINA) CO., LTD., Shenzhen (CN)

(72) Inventors: Xue-Hui Liu, Shenzhen (CN); Lei Li, Shenzhen (CN)

(73) Assignee: ASIA VITAL COMPONENTS (CHINA) CO., LTD., Shenzhen (CN)

( * ) Notice: Subject to any disclaimer, the term of this patent is extended or adjusted under 35 U.S.C. 154(b) by 171 days.

(21) Appl. No.: 18/133,481

(22) Filed: Apr. 11, 2023

(65) Prior Publication Data
US 2024/0349459 A1  Oct. 17, 2024

(30) Foreign Application Priority Data
May 31, 2022 (TW) .................................. 111120247

(51) Int. Cl.
*H01L 23/40* (2006.01)
*H05K 7/20* (2006.01)

(52) U.S. Cl.
CPC ...... *H05K 7/2049* (2013.01); *H01L 2023/405* (2013.01); *H01L 2023/4081* (2013.01); *H01L 2023/4087* (2013.01)

(58) Field of Classification Search
CPC ....... H05K 7/2049; H01L 23/4006–2023/4087
See application file for complete search history.

(56) References Cited

U.S. PATENT DOCUMENTS 5,662,163 A * 9/1997 Mira .................... H01L 23/4006
361/720
5,770,891 A * 6/1998 Frankeny ............... H01R 12/52
361/783

(Continued)

FOREIGN PATENT DOCUMENTS

CN  104538342 A  4/2015
CN  103928601 B  12/2018

(Continued)

OTHER PUBLICATIONS

Search Report dated Jul. 5, 2024 issued by China National Intellectual Property Administration for counterpart application No. 2022106140096.

*Primary Examiner* — Zachary Pape
(74) *Attorney, Agent, or Firm* — Demian K. Jackson; Jackson IPG PLLC

(57) ABSTRACT

A structure for evenly applying forces on a heat dissipation base plate includes a heat dissipation base plate having upper and lower surface, a first threaded hole, and through bores provided at four corners thereof, and being held in place on a heat source by screw fastening elements extended through the through bores for the lower surface to contact with the heat source; a hold-down member disposed on the upper surface of the heat dissipation base plate and having upper and lower side and a second threaded hole extending from the upper to the lower side; and an adjustment element including a screw bolt and a turning knob connected to the screw bolt, the screw bolt being extended through the first and second threaded holes, and turnable by the screw bolt to downward press against and apply evenly distributed forces on a central area of the heat dissipation base plate.

5 Claims, 6 Drawing Sheets

(56) References Cited

U.S. PATENT DOCUMENTS

| | | | |
|---|---|---|---|
| 7,095,614 B2* | 8/2006 | Goldmann | H01L 23/4006 |
| | | | 165/185 |
| 10,978,372 B1 | 4/2021 | Tong | |
| 2010/0301182 A1* | 12/2010 | Guo | H01L 23/4006 |
| | | | 248/309.1 |
| 2013/0048820 A1 | 2/2013 | Zhu et al. | |
| 2021/0144884 A1 | 5/2021 | Mou et al. | |

FOREIGN PATENT DOCUMENTS

| | | | | |
|---|---|---|---|---|
| CN | 111029317 A | 4/2020 | | |
| CN | 112638115 A | 4/2021 | | |
| CN | 214800396 U | 11/2021 | | |
| CN | 109508078 B | * 2/2022 | | G06F 1/183 |
| CN | 217523130 U | 9/2022 | | |
| TW | M387476 U | 8/2010 | | |

* cited by examiner

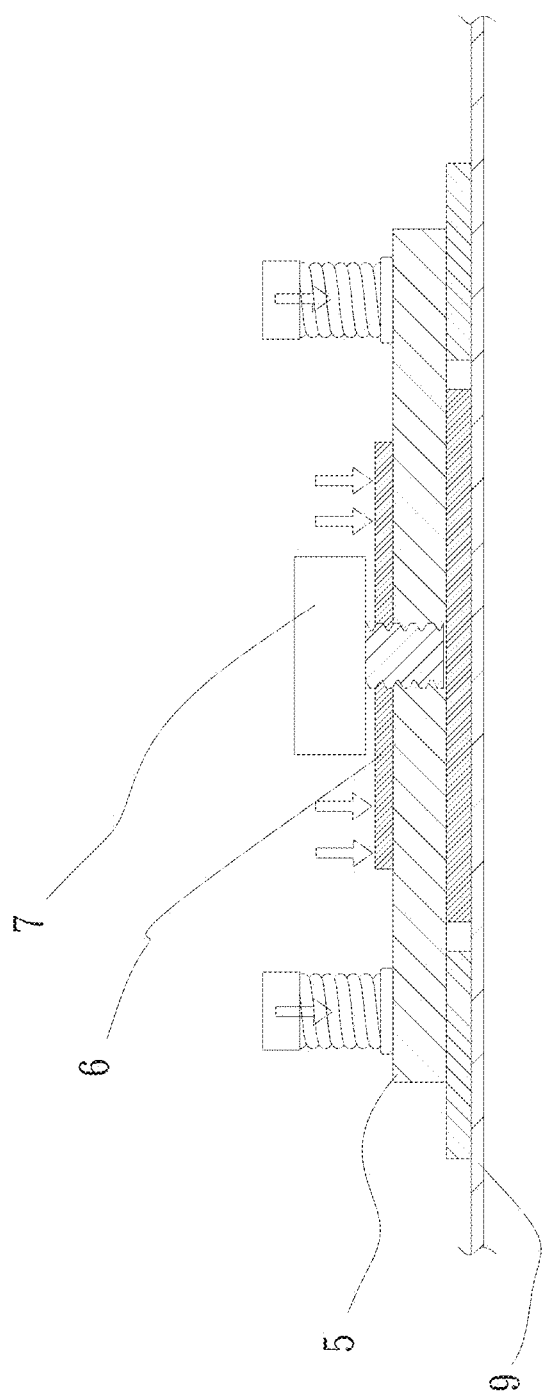

STRUCTURE FOR EVENLY APPLYING FORCES ON A HEAT DISSIPATION BASE PLATE

This application claims the priority benefit of Taiwan patent application number 111120247 filed on May 31, 2022.

FIELD OF THE INVENTION

The present invention relates to a structure for evenly applying forces on a heat dissipation base plate, and more particularly, to a structure that enables a heat dissipation base plate or a heat transfer element to more evenly and fitly contact with a heat source.

BACKGROUND OF THE INVENTION

Heat transfer element and heat dissipation element are a commonly seen combination for contacting with a heat source and transferring heat from the heat source to a remote location for dissipating into ambient air. Generally, the heat transfer element includes a base having better heat conductivity, it works together with heat pipes or vapor chambers to evenly guide out or transfer the heat produced by the heat source to a remote location for dissipation. However, the heat pipes or the vapor chambers must be fixed to the base, or be fixed to the base and a fixing seat located around the heat source.

Please refer to FIGS. 1a and 1b, which show a conventional thermal module. On a conventional motherboard of an electronic device, there is at least one heat source 1. Each of the heat sources 1 has a heat sink 4 correspondingly contacting therewith to dissipate heat produced by the heat source 1. To fix the heat sink 4 in place corresponding to the heat source 1, a fixing seat 2 is provided around the heat source 1, and the heat sink 4 is connected at four corners thereof to the fixing seat 2 using screw fasteners, so that the heat sink 4 is in contact with the heat source 1 to absorb and transfer the heat produced by the heat source 1 to a remote location.

Nowadays, high performance and high power chips are used in electronic devices for them to provide highly enhanced computing power. The chip in processing data will produce a relatively high amount of heat to form a heat source 1. Conventionally, the chip is packaged or encapsulated to avoid the chip from being damaged. With the enhanced computing power thereof, the chip in processing data produces even more heat than ever before. However, the package of the chip adversely affects the produced heat from efficiently dissipating into outer environment. Further, there are also many currently available chips being provided in the form of bare dies without any package to protect their surfaces. The surface of a bare die is usually a non-smooth surface. When fixing the heat sink 4 to a top of the bare chip, i.e. the heat source 1, the fastening strength at the fixing points should be adjusted one by one to ensure that the heat sink 4 is in tight contact with the heat source 1 and prevent the heat source 1 in the form of bare die from breaking under excessive downward pressure from the heat sink 4. However, in the existing assembling manner, the heat sink 4 is fixed to the top of the heat source 1 (bare chip) on a production line with a power driver being handled manually or via a robotic arm to tighten screw fasteners at a very quick speed, and it is impossible to sequentially tighten the screw fasteners one by one in a diagonal direction and to make necessary adjustment of the tightening strength of the screw fasteners one by one. On the production line, each of the screw fasteners is quickly and fully tightened. This tends to result in uneven distribution of forces on four corners of the heat sink 4, and it is impossible for the heat sink 4 to completely flatly contact with the top of the heat source 1 and ensure whether a proper tightening strength is applied to the heat sink 4 and the heat source 1.

In the event the screw fasteners are not sequentially fastened in the diagonal direction, it is possible only the four corners of the heat sink 4 are tightly attached to the fixing seat 2 while a central area of the heat sink 4 corresponding to the heat source 1 is arched and deformed when the four corners of the heat sink 4 are downward pressed by the screw fasteners. A gap will form between the arched central area of the heat sink 4 and the heat source 1 and a thermal resistance will occur at the location with the gap to cause unevenly heated heat sink 4 or ineffective heat transfer of the heat sink 4. Meanwhile, in the event the heat sink 4 is directly fixed to the top of the heat source 1 with an excessive downward fastening force in one time, it tends to cause breaking or damage to the bare die.

It is therefore an important goal of thermal module manufacturers to make necessary improvement for all areas of the heat sink 4 to be in fit and tight contact with the heat source 1.

SUMMARY OF THE INVENTION

To effectively solve the problem in the conventional thermal module, a primary object of the present invention is to provide a structure for evenly applying forces on a heat dissipation base plate, so that the entire heat dissipation base plate is subjected to evenly distributed downward forces to be in fit and tight contact with a heat source; meanwhile, a bonding strength of the heat dissipation base plate to the heat source is finely adjustable.

To achieve the above and other objects, the structure for evenly applying forces on a heat dissipation base plate according to an embodiment of the present invention includes a heat dissipation base plate, a hold-down member, and an adjustment element. The heat dissipation base plate has an upper surface and a lower surface, and includes a first threaded hole and at least one through bore. The through bore is provided at each of four corners of the heat dissipation base plate. A screw fastening element is extended through each of the through bores to hold the heat dissipation base plate in place on a heat source with the lower surface of the heat dissipation base plate being in contact with the heat source. The hold-down member is disposed on the upper surface of the heat dissipation base plate, and has an upper side and a lower side and includes a second threaded hole extending from the upper side to the lower side. The adjustment element includes a screw bolt having a free end and an opposite end, and a turning knob connected to the opposite end of the screw bolt. The free end of the screw bolt is correspondingly extended through the first and second threaded holes, and the turning knob is operable to turn the screw bolt of the adjustment element to thereby force the hold-down member to apply evenly distributed downward forces on a central area of the heat dissipation base plate. By operating the turning knob, it is able to finely adjust a contact force between the heat dissipation base plate and the heat source. When the downward forces are gradually increased, it is able to protect the heat source from breaking and damage due to excessive pressure applied to the heat source by the heat dissipation base plate.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein

FIG. 1b is an assembled sectional view of FIG. 1a;

FIG. 3b is a sectional view of FIG. 3a; and

DETAILED DESCRIPTION OF THE PREFERRED EMBODIMENTS

The present invention will now be described with a preferred embodiment thereof.

Figure 1A:
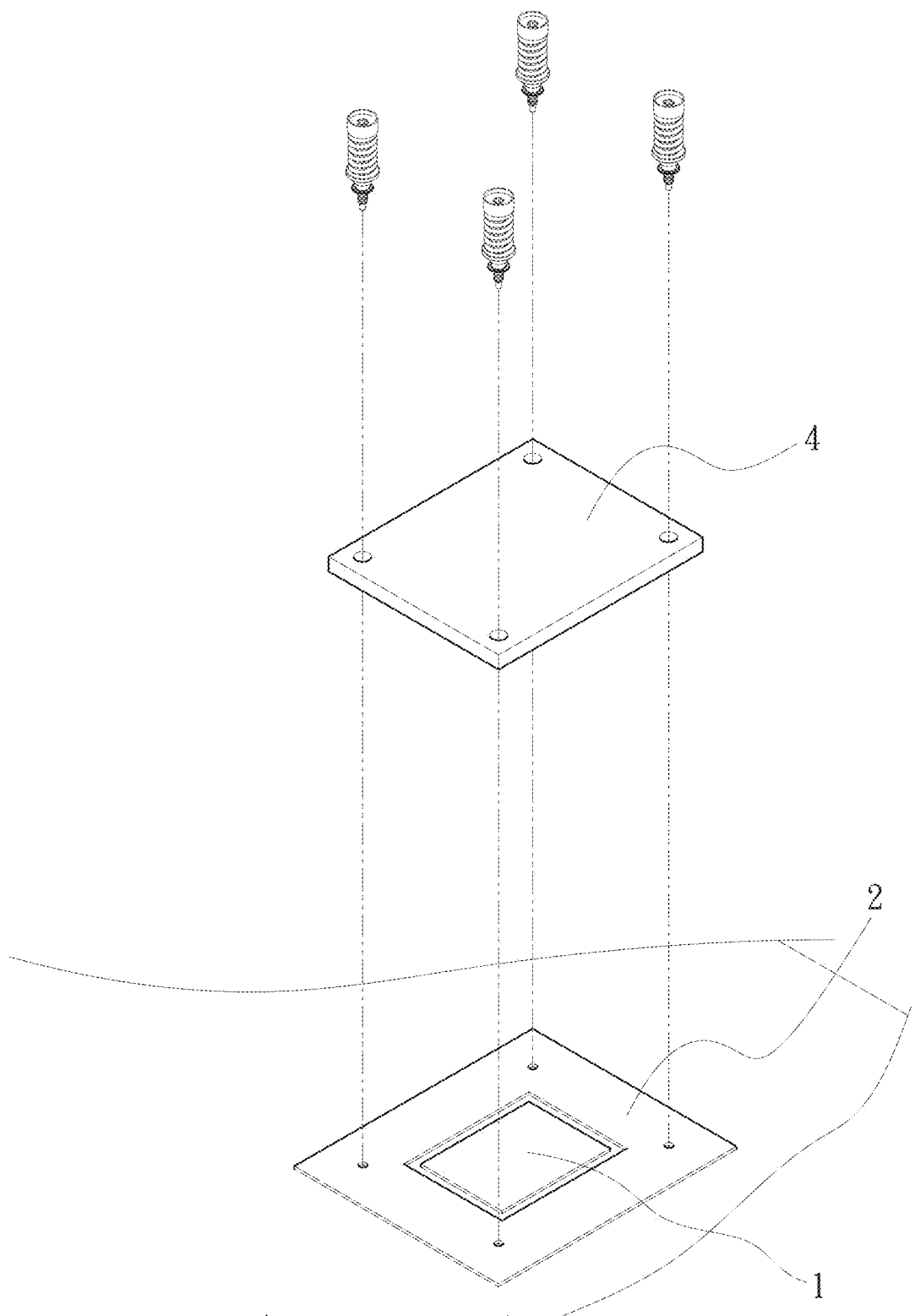
FIG. 1a is an exploded perspective view showing the connection of a conventional thermal module to a heat source.
Figure 1B:
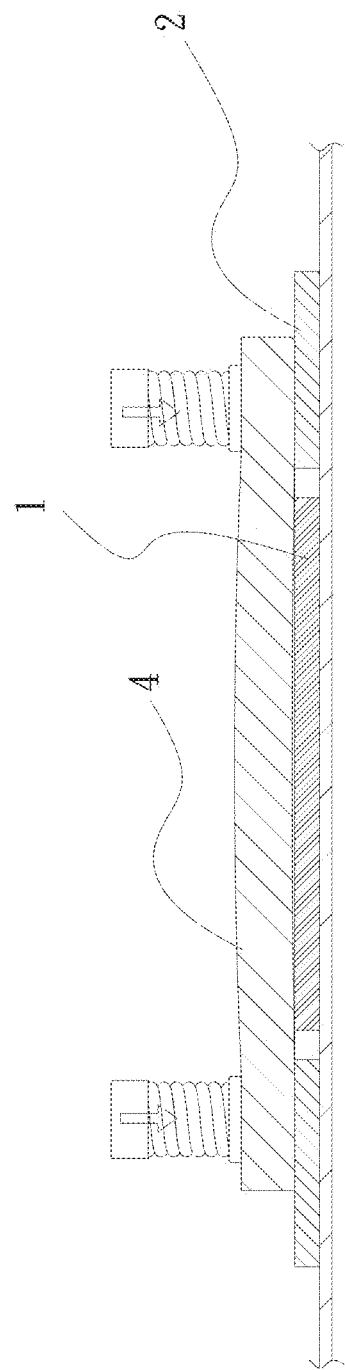
Figure 2:
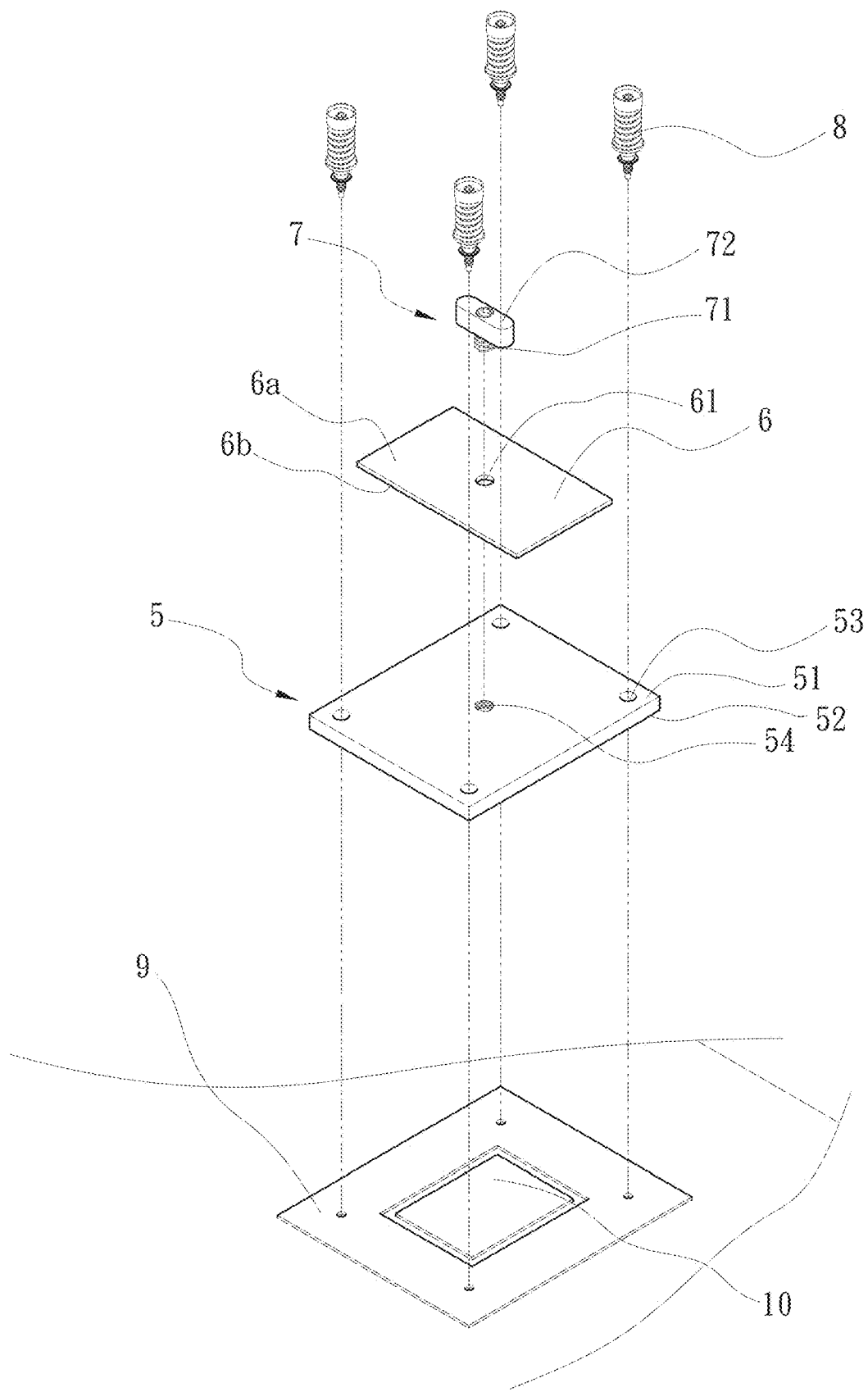
FIG. 2 is an exploded perspective view of a structure for evenly applying forces on a heat dissipation base plate according to an embodiment of the present invention.
Figure 3A:
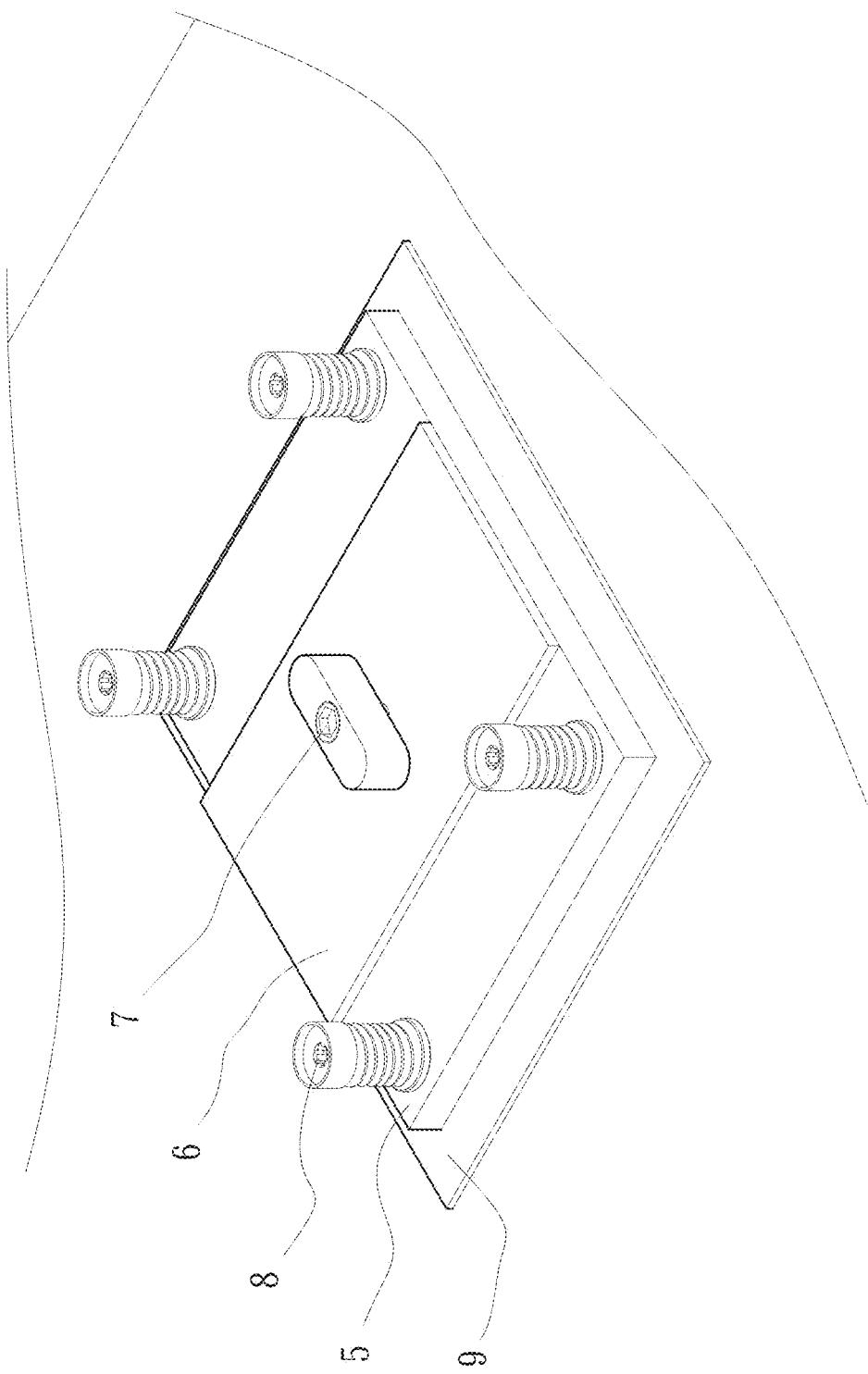
FIG. 3a is an assembled view of FIG. 2.

Please refer to FIG. 2, which is an exploded perspective view of a structure for evenly applying forces on a heat dissipation base plate according to an embodiment of the present invention; and to FIGS. 3a and 3b, which are assembled perspective and sectional views, respectively, of FIG. 2. For the purpose of conciseness and clarity, the structure for evenly applying forces on a heat dissipation base plate of the present invention is also briefly referred to as "the Structure" herein. As shown, the Structure includes a heat dissipation base plate 5, a hold-down member 6, and an adjustment element 7.

The heat dissipation base plate 5 has an upper surface 51 and a lower surface 52 located on a top and a bottom side of the heat dissipation base plate 5, respectively. The heat dissipation base plate 5 is formed with at least one through bore 53 and a first threaded hole 54. The first threaded hole 54 is provided on the upper surface 51, it can be a hole extending through the heat dissipation base plate 5 or a blind hole. In the illustrated embodiment, there is one through bore 53 provided at each of four corners of the heat dissipation base plate 5 to extend from the upper surface 51 to the lower surface 52. The heat dissipation base plate 5 is fixedly held in place on a heat source 10 by threading a screw fastening element 8 through each of the through bores 53, such that the lower surface 52 is in contact with the heat source 10. Alternatively, the heat dissipation base plate 5 is fixedly connected to a target unit, such as a fixing seat, a circuit substrate, or a heat transfer element, by the screw fastening elements 8. In the illustrated embodiment, the heat dissipation base plate 5 is fixed to a fixing seat 9 by the screw fastening elements 8. However, it is understood the present invention is not particularly limited thereto.

The hold-down member 6 has an upper side 6a and a lower side 6b, and is disposed on a central area of the upper surface 51 of the heat dissipation base plate 5 with the lower side 6b in contact with the upper surface 51. A second threaded hole 61 is formed on the hold-down member 6 to extend from the upper side 6a to the lower side 6b. The hold-down member 6 can be a plate, a sheet, a strip or a frame in a rectangular shape, a cross shape, an X shape, a star shape, a letter-n shape, or a hollow square shape. In the illustrated embodiment, the hold-down member 6 is in a rectangular shape. However, it is understood the illustrated embodiment is non-restrictive. The hold-down member 6 applies evenly distributed downward forces on the entire heat dissipation base plate 5, such that not only the four corners but also the central area of the heat dissipation base plate 5 are subjected to the downward forces.

The adjustment element 7 includes a screw bolt 71 having a free end and an opposite end, and a turning knob 72 connected to the opposite end of the screw bolt 71. In the illustrated embodiment, the turning knob 72 is in the form of a crosspiece perpendicularly connected to the opposite end of the screw bolt 71 to give the adjustment element 7 a T-shaped configuration. The screw bolt 71 is externally threaded, and its free end is sized for correspondingly threading through the first and second threaded holes 54, 61. The turning knob 72 can be turned to rotate the screw bolt 71 clockwise or counterclockwise, so that the free end of the screw bolt 71 is screwed into the first and second threaded holes 54, 61 to force the hold-down member 6 to tightly and fitly contact with the heat dissipation base plate 5. With the downward force applied by the hold-down member 6 to the central area of the heat dissipation base plate 5, the latter can be in tight contact with the heat source 10 without any clearance between them to thereby enable upgraded heat transfer performance. The adjustment element 7 also enables fine adjustment of a bonding strength between the hold-down member 6 and the heat dissipation base plate 5. In other words, the hold-down member 6 provides the heat dissipation base plate 5 with evenly distributed downward forces toward the heat source 10. In the case the heat source 10 is in the form of a bare die, the adjustment element 7 can be properly turned to finely adjust the downward forces applied by the hold-down member 6 to the heat dissipation base plate 5 and accordingly, protects the bare die from any breaking or damage on the surface thereof due to excessive downward pressure against the bare die.

The heat dissipation base plate 5 and the heat source 10 may otherwise have a receiving space existing between them for receiving at least one heat transfer element therein. The heat transfer element is superposed on the heat source 10. The hold-down member 6 can apply evenly distributed downward forces on the heat dissipation base plate 5 for the heat transfer element to more tightly contact with the heat source 10. The heat transfer element can be a heat pipe or a vapor chamber. In the illustrated embodiment, the heat transfer element may be a heat pipe. However, it is understood the present invention is not particularly limited thereto.

Figure 4:
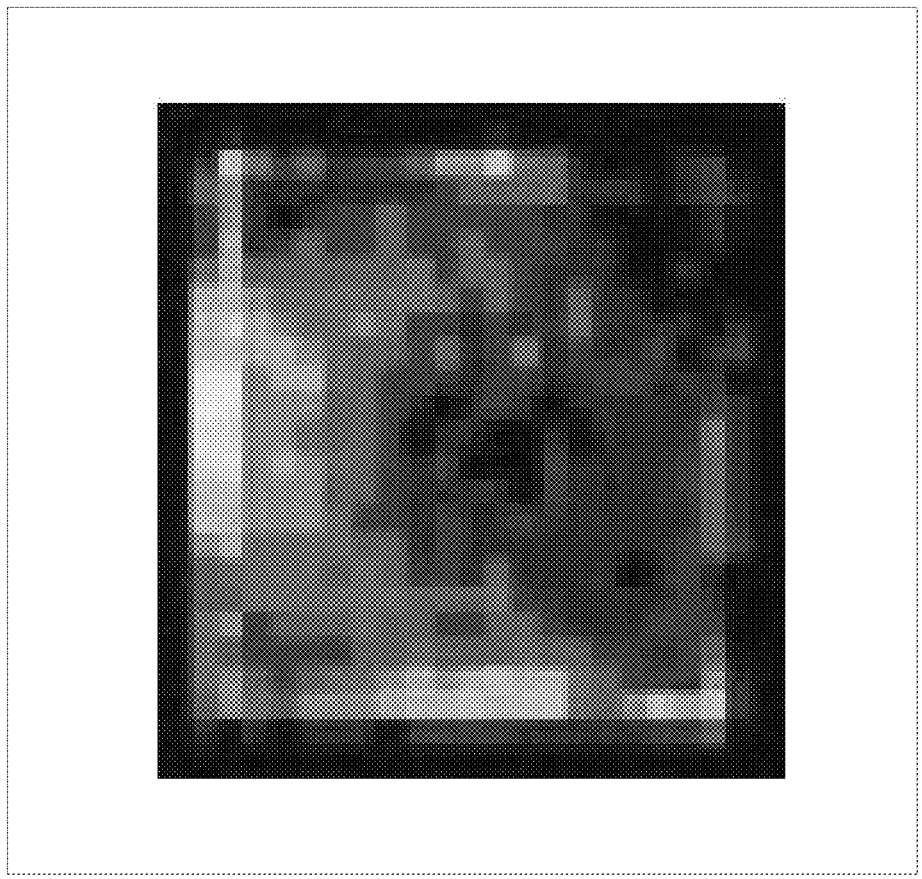
FIG. 4 is a thermogram of the structure for evenly applying forces on a heat dissipation base plate according to the present invention.

FIG. 4 is a three-dimensional thermogram of the heat dissipation base plate 5 in the present invention. Please refer to FIG. 4 along with FIGS. 2, 3a and 3b. When the screw fastening elements 8 are quickly extended through the through bores 53 at the four corners of the heat dissipation base plate 5, the latter is fixedly fastened to the fixing seat 9, and there is not any image in the thermogram of FIG. 4 showing it is affected by heat. Then, the adjustment element 7 is turned clockwise or counterclockwise to thread the screw bolt 71 into the first and second threaded holes 54, 61 for the hold-down member 6 to slowly press against the central area of the heat dissipation base plate 5 and apply a downward hold-down force thereon. By doing this, the heat dissipation base plate 5, which initially has only four corners fixed in place while the central area thereof is not in tight contact with the heat source 10, now has evenly distributed downward forces applied to its central area by the hold-down member 6. As a result, the heat dissipation base plate 5 and the heat source 10 do not have any clearance existed between them to enable upgraded heat transfer performance. The thermogram of FIG. 4 shows that a generally uniform color is distributed over all locations, which means the heat source 10 is under evenly distributed forces from the heat dissipation base plate 5 and accordingly, heat from the heat source 10 is also evenly distributed in the thermogram.

The present invention is characterized in providing a structure for evenly applying forces on a heat dissipation base plate for the latter to fully tightly press against a heat source, so that heat can be evenly transferred from the heat source to the heat dissipation base plate while effectively overcome the problem of thermal resistance that occurs if the heat source and the heat dissipation base plate are not in full contact with one another. The Structure of the present invention is also characterized in providing an adjustment element for finely adjusting a bonding strength of the heat dissipation base plate to the heat source.

The present invention has been described with a preferred embodiment thereof and it is understood that many changes and modifications in the described embodiment can be carried out without departing from the scope and the spirit of the invention that is intended to be limited only by the appended claims.

What is claimed is:

1. A structure for evenly applying forces on a heat dissipation base plate, comprising:
   a heat dissipation base plate having an upper surface and a lower surface, and including a first threaded hole and at least one through bore; the through bore being provided at each of four corners of the heat dissipation base plate; and a screw fastening element being extended through each of the through bores to hold the heat dissipation base plate in place on a heat source with the lower surface of the heat dissipation base plate being in contact with the heat source;
   a hold-down member being disposed on the upper surface of the heat dissipation base plate, and having an upper side and a lower side and including a second threaded hole extending from the upper side to the lower side; and
   an adjustment element including a screw bolt having a free end and an opposite end, and a turning knob connected to the opposite end of the screw bolt; the free end of the screw bolt being correspondingly extended through the first and second threaded holes, and the turning knob being operable to turn the screw bolt of the adjustment element to thereby force the hold-down member to apply evenly distributed downward forces on a central area of the heat dissipation base plate.

2. The structure for evenly applying forces on a heat dissipation base plate as claimed in claim 1, wherein the heat dissipation base plate has a top side and a bottom side; and the first threaded hole being formed on the top side.

3. The structure for evenly applying forces on a heat dissipation base plate as claimed in claim 1, wherein the turning knob is in the form of a crosspiece perpendicularly connected to the opposite end of the screw bolt.

4. The structure for evenly applying forces on a heat dissipation base plate as claimed in claim 1, wherein the hold-down member is disposed on a central area of the upper surface of the heat dissipation base plate.

5. The structure for evenly applying forces on a heat dissipation base plate as claimed in claim 1, wherein the through bores are extended from the upper surface to the lower surface of the heat dissipation base plate.

* * * * *